(12) United States Patent
Cheng et al.

(10) Patent No.: US 9,082,853 B2
(45) Date of Patent: Jul. 14, 2015

(54) BULK FINFET WITH PUNCHTHROUGH STOPPER REGION AND METHOD OF FABRICATION

(71) Applicant: International Business Machines Corporation, Armonk, NY (US)

(72) Inventors: Kangguo Cheng, Schenectady, NY (US); Ali Khakifirooz, Mountain View, CA (US); Shom Ponoth, Clifton Park, NY (US); Ragvahasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 13/664,873

(22) Filed: Oct. 31, 2012

(65) Prior Publication Data

US 2014/0117462 A1   May 1, 2014

(51) Int. Cl.
*H01L 29/78* (2006.01)
*H01L 21/762* (2006.01)
*H01L 29/66* (2006.01)

(52) U.S. Cl.
CPC ...... *H01L 29/7851* (2013.01); *H01L 21/76224* (2013.01); *H01L 29/66803* (2013.01); *H01L 29/66818* (2013.01)

(58) Field of Classification Search
CPC ............ H01L 21/225; H01L 21/76224; H01L 29/7851
USPC .......................................... 257/410
See application file for complete search history.

(56) References Cited

U.S. PATENT DOCUMENTS

| 7,332,386 | B2 | 2/2008 | Lee et al. | |
|---|---|---|---|---|
| 7,960,734 | B2 | 6/2011 | Lenoble | |
| 2007/0134864 | A1* | 6/2007 | Anderson et al. | 438/197 |
| 2009/0294800 | A1* | 12/2009 | Cheng et al. | 257/192 |
| 2011/0049613 | A1* | 3/2011 | Yeh et al. | 257/327 |
| 2011/0121404 | A1 | 5/2011 | Shifren et al. | |
| 2012/0009744 | A1 | 1/2012 | Inaba | |
| 2012/0025313 | A1 | 2/2012 | Chang et al. | |
| 2012/0083107 | A1 | 4/2012 | Chang et al. | |
| 2012/0104472 | A1 | 5/2012 | Xu et al. | |
| 2013/0126972 | A1* | 5/2013 | Wang et al. | 257/351 |
| 2013/0280883 | A1* | 10/2013 | Faul et al. | 438/434 |

OTHER PUBLICATIONS

Cho, Won-Ju et al.; Fabrication of p-type fin field-effect-transistors by solid-phase boron diffusion process using thin film doping sources; Thin Solid Films 515; 2007; pp. 3709-3713.

* cited by examiner

*Primary Examiner* — Duy T Nguyen
*Assistant Examiner* — Mounir Amer
(74) *Attorney, Agent, or Firm* — Joseph P. Abate; Howard M. Cohn

(57) ABSTRACT

An improved bulk FinFET with a punchthrough stopper region, and method of fabrication are disclosed. The dopants used to form the punchthrough stopper are supplied from a shallow trench isolation liner. An anneal diffuses the dopants from the shallow trench isolation liner into the bulk substrate and lower portion of the fins, to form the punchthrough stopper region.

12 Claims, 10 Drawing Sheets

BULK FINFET WITH PUNCHTHROUGH STOPPER REGION AND METHOD OF FABRICATION

FIELD OF THE INVENTION

The present invention relates generally to semiconductor devices, and more particularly to structures and formation methods of fin field-effect transistors (FinFETs).

BACKGROUND OF THE INVENTION

With the continuing trend towards miniaturization of integrated circuits (ICs), there is a need for transistors to have higher drive currents with increasingly smaller dimensions. FinFET technology is becoming more prevalent as device size continues to shrink. Silicon-on-insulator (SOI) finFET devices have excellent electrical performance. However, the manufacturing cost is high. Bulk finFETs, where there is no insulator film between the fins and the substrate, have a lower manufacturing cost as compared with a SOI finFET. However, bulk finFETs are prone to punchthrough currents (leakage currents) which can degrade the electrical performance. To address the issue of the punchthrough currents, a dopant implantation is performed using a dopant type opposite to that of the source/drain regions of the finFET, forming what is known as a "punchthrough stopper." The formation of the punchthrough stopper can introduce undesired device variability. It is therefore desirable to have an improved bulk finFET with a punchthrough stopper and method of fabrication.

SUMMARY OF THE INVENTION

In one embodiment of the present invention, a semiconductor structure is provided. The semiconductor structure comprises a semiconductor substrate, a plurality of fins formed in the semiconductor substrate, wherein each fin has an upper portion and a lower portion, a punchthrough stopper region disposed in the lower portion of each fin of the plurality of fins, a doped shallow trench isolation liner disposed between each fin, a shallow trench isolation region disposed between each fin, a gate dielectric layer disposed over the plurality of fins, and a gate region disposed over the gate dielectric layer.

In another embodiment of the present invention, a method of forming a punchthrough stopper region on a bulk finFET is provided. The method comprises depositing a shallow trench isolation liner over a semiconductor structure, wherein the semiconductor structure comprises a plurality of fins formed in a semiconductor substrate, depositing a shallow trench isolation region over the shallow trench isolation liner, recessing the shallow trench isolation region, and annealing the semiconductor structure. In another embodiment of the present invention, a method of forming a punchthrough stopper region on a bulk finFET is provided. This method comprises performing a first etch to a first depth to form a plurality of fins on a semiconductor substrate, forming a spacer on each side of each fin of the plurality of fins, performing a second etch to a second depth to extend the length of the plurality of fins, depositing a shallow trench isolation liner over the plurality of fins, depositing a shallow trench isolation region over the shallow trench isolation liner, recessing the shallow trench isolation region, and annealing the bulk finFET.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
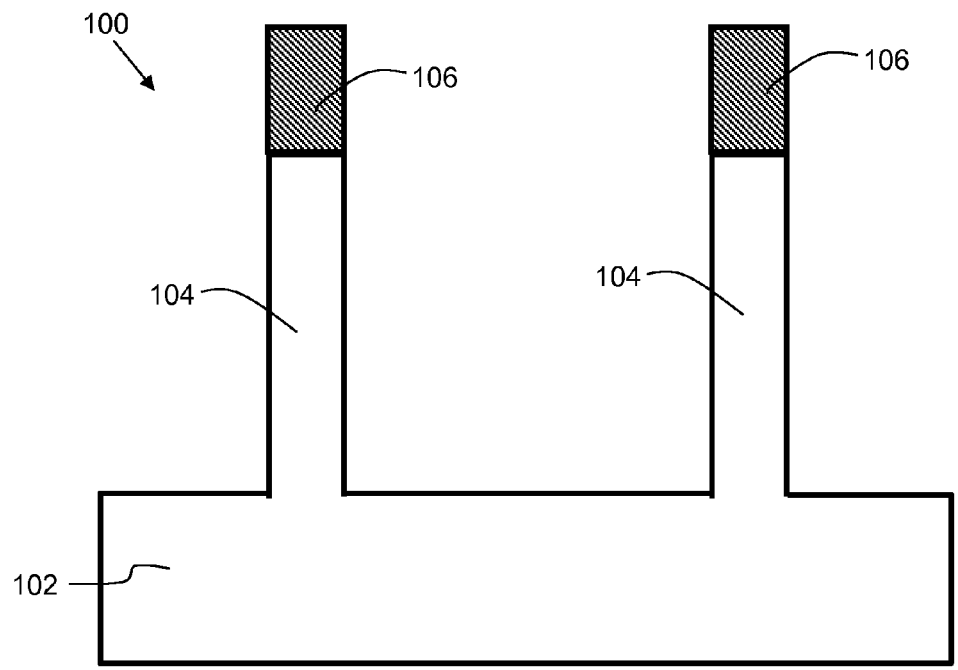

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for an embodiment of the present invention.

Figure 2:
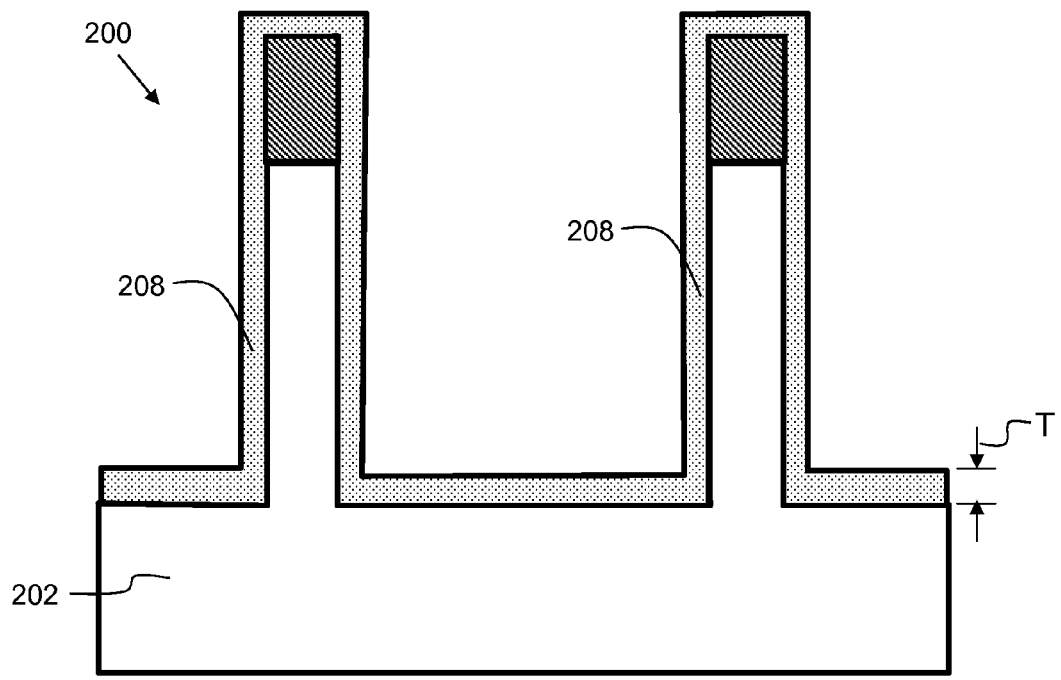

FIG. 2 shows a semiconductor structure after a subsequent processing step for an embodiment of the present invention of depositing a shallow trench isolation liner.

Figure 3:
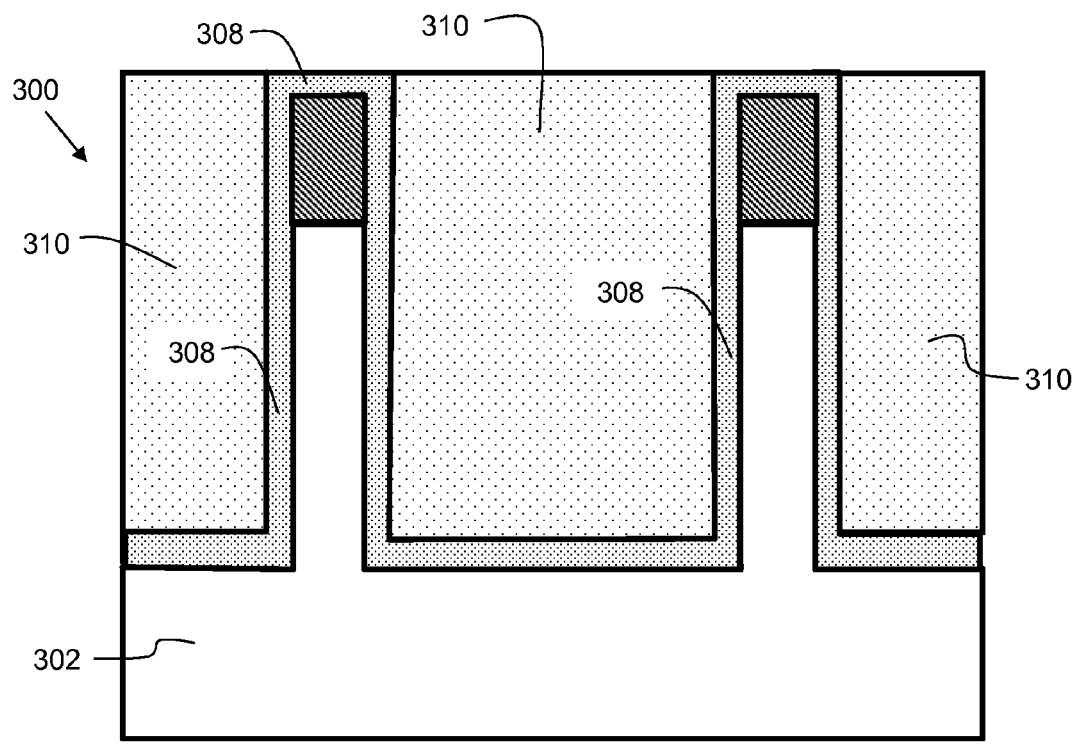

FIG. 3 shows a semiconductor structure after a subsequent processing step for an embodiment of the present invention of forming shallow trench isolation regions.

Figure 4:
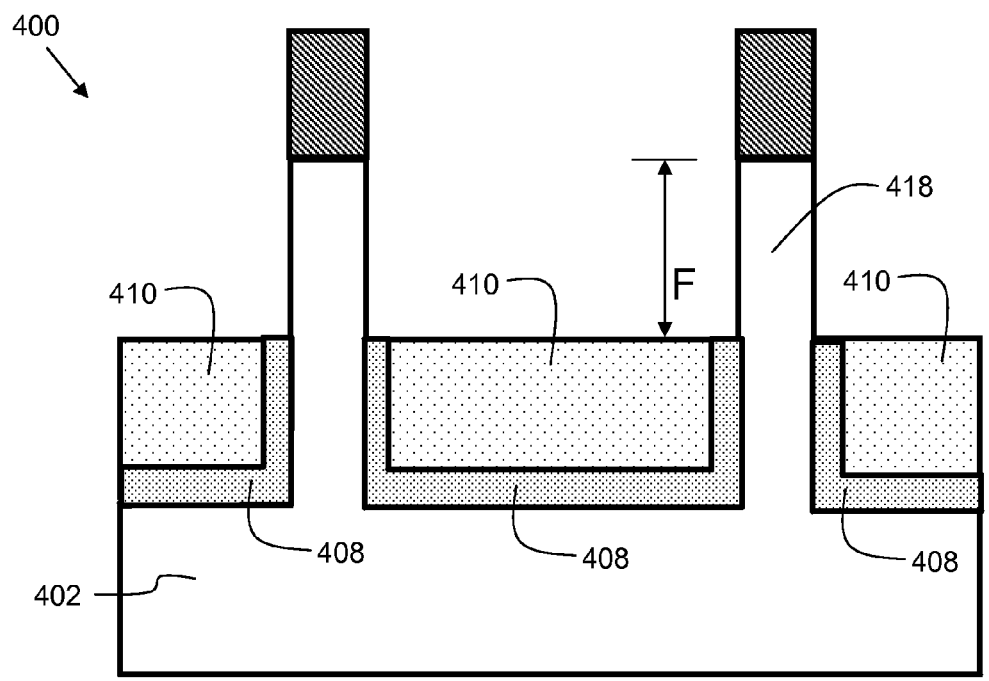

FIG. 4 shows a semiconductor structure after a subsequent processing step for an embodiment of the present invention of performing a shallow trench isolation region recess.

Figure 5:
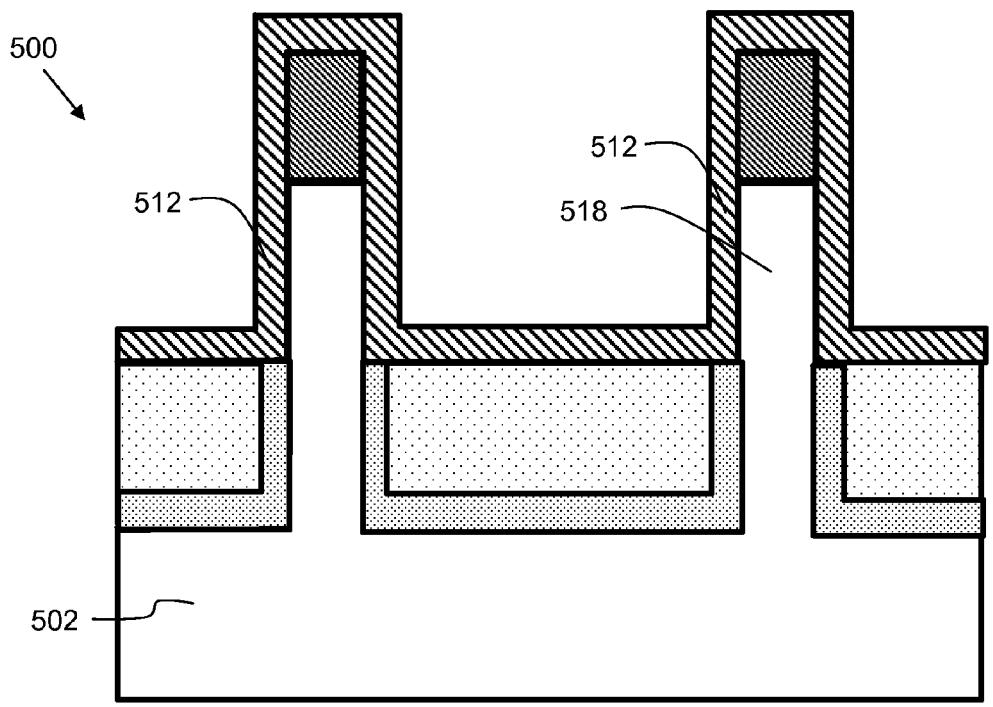

FIG. 5 shows a semiconductor structure after a subsequent optional processing step for an embodiment of the present invention of depositing a cap layer.

Figure 6:
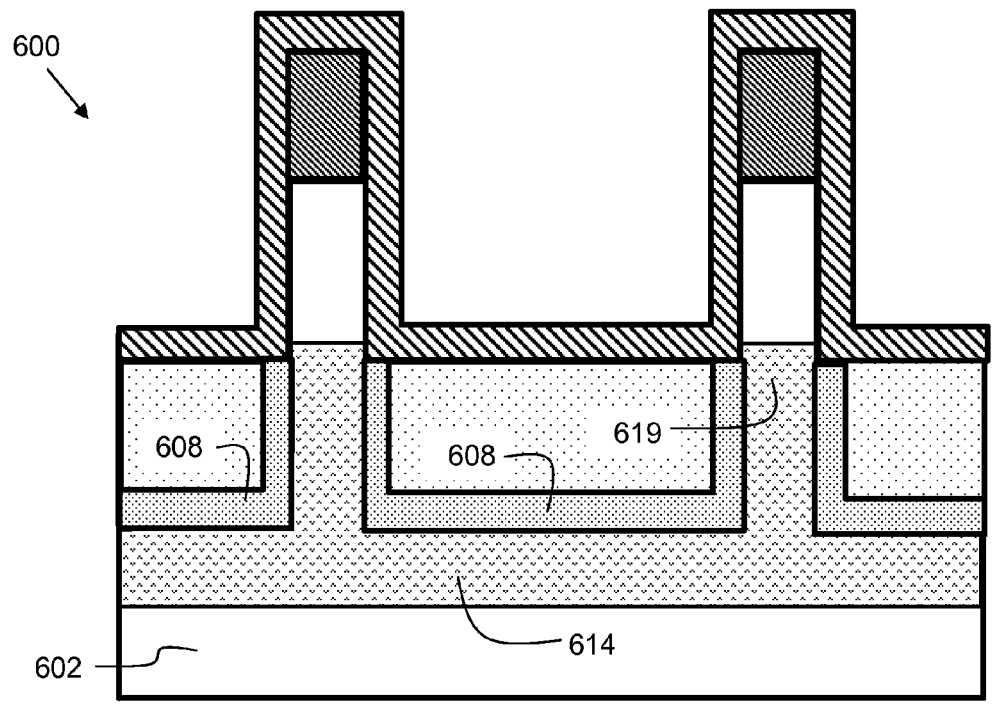

FIG. 6 shows a semiconductor structure after a subsequent processing step for an embodiment of the present invention of performing an anneal.

Figure 7:
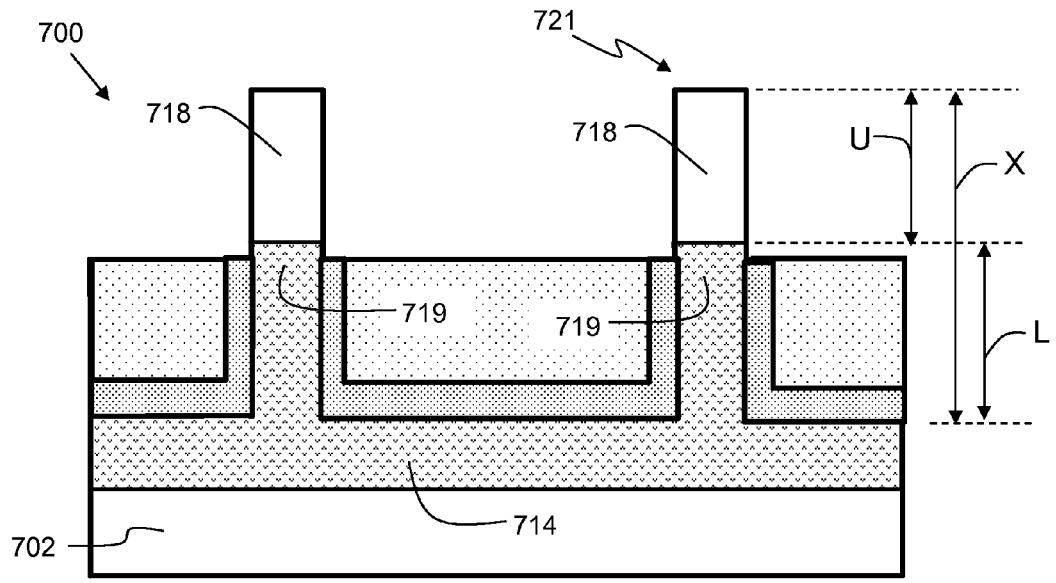

FIG. 7 shows a semiconductor structure after a subsequent optional processing step for an embodiment of the present invention of removing the optional cap layer and pad layer.

Figure 8:
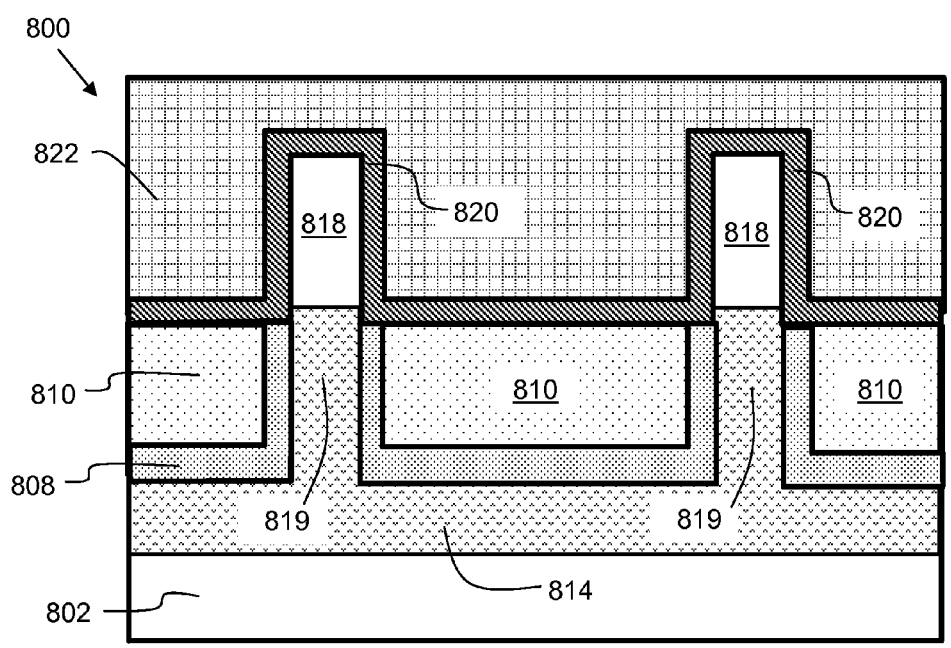

FIG. 8 shows a semiconductor structure in accordance with an embodiment of the present invention.

Figure 9:
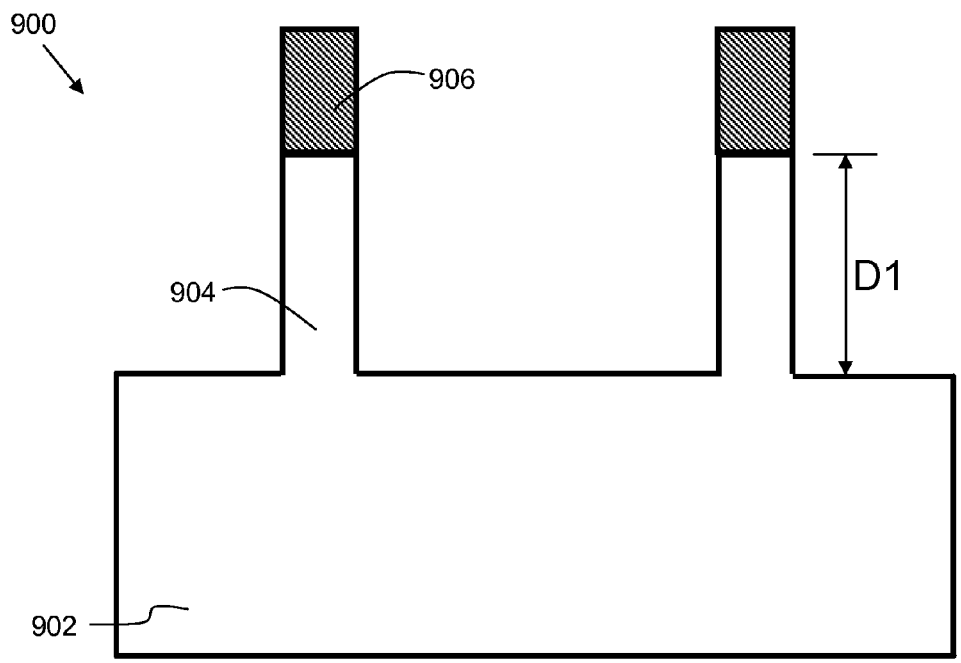

FIG. 9 shows a semiconductor structure at a starting point for another embodiment of the present invention.

Figure 10:
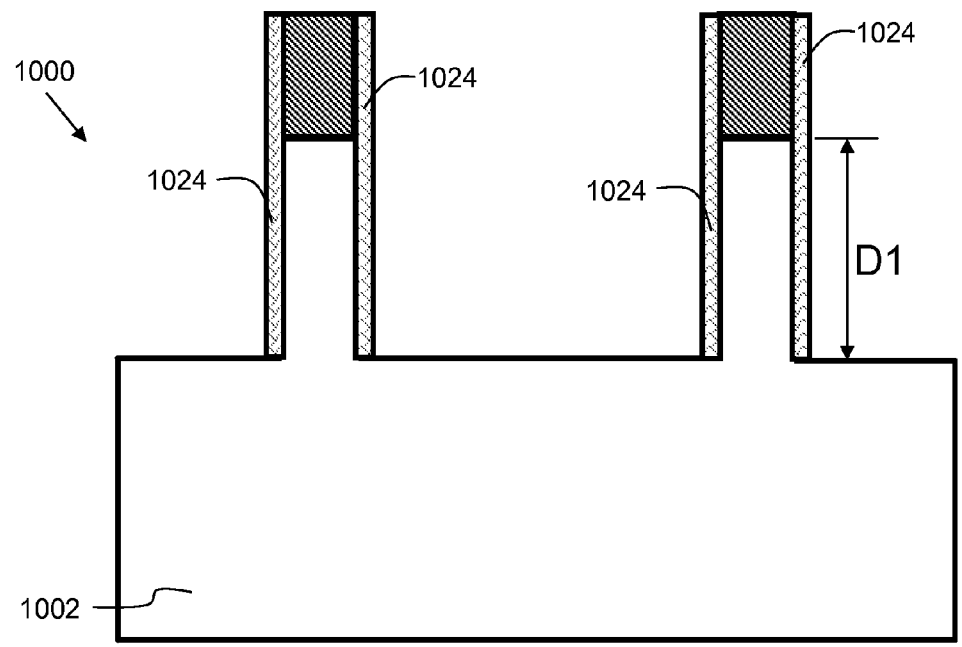

FIG. 10 shows a semiconductor structure after a subsequent processing step for the embodiment of FIG. 9 of forming spacers on fin sidewalls.

Figure 11:
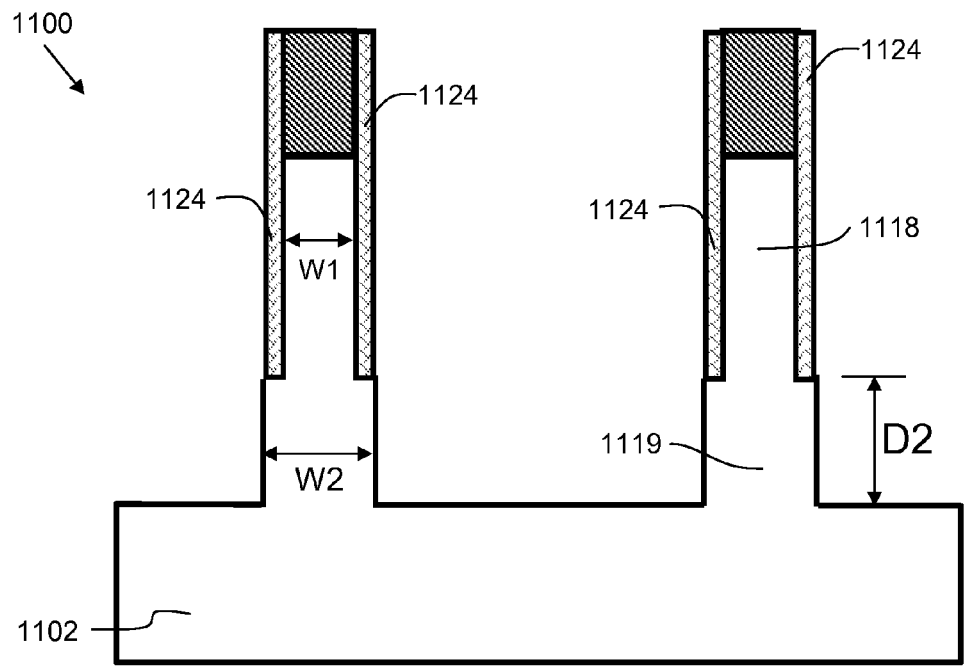

FIG. 11 shows a semiconductor structure after a subsequent processing step for the embodiment of FIG. 9 of performing a second etch.

Figure 12:
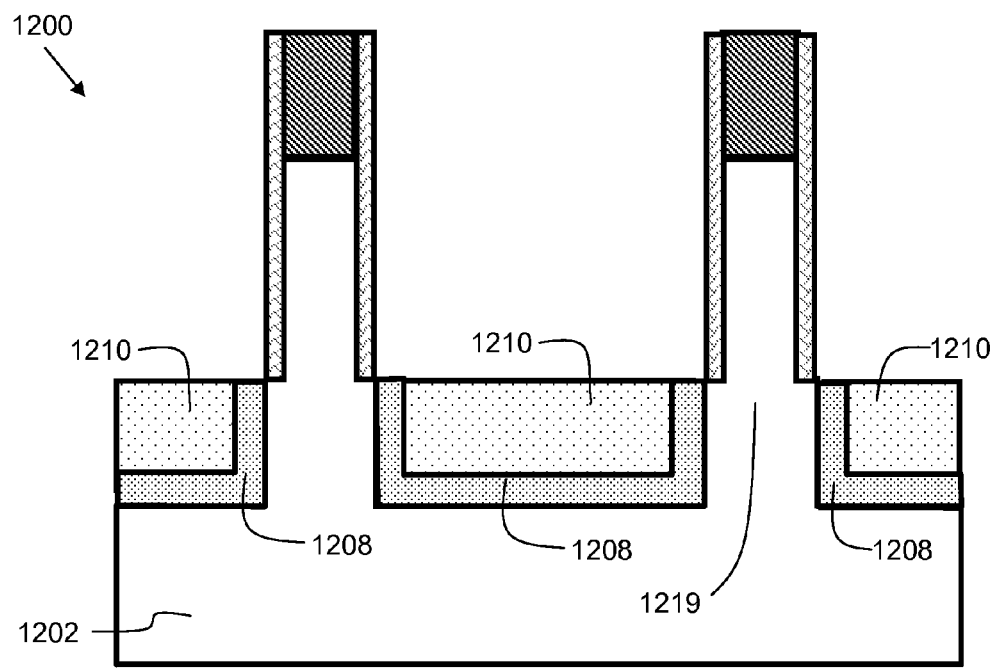

FIG. 12 shows a semiconductor structure after a subsequent processing step for the embodiment of FIG. 9 of depositing a shallow trench isolation liner and shallow trench isolation region.

Figure 13:
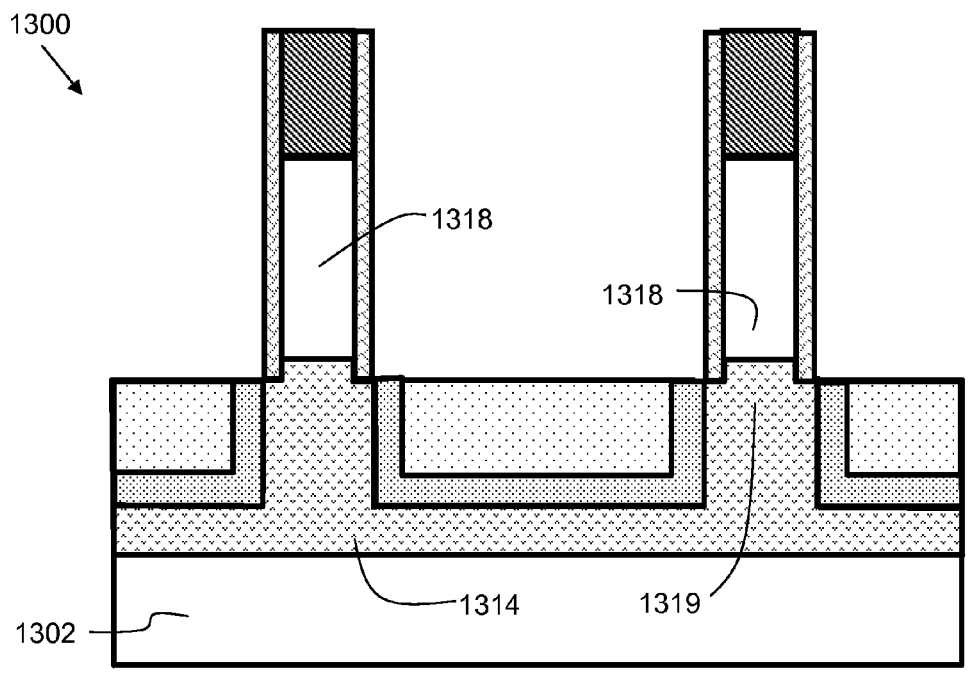

FIG. 13 shows a semiconductor structure after a subsequent processing step for the embodiment of FIG. 9 of performing an anneal.

Figure 14:
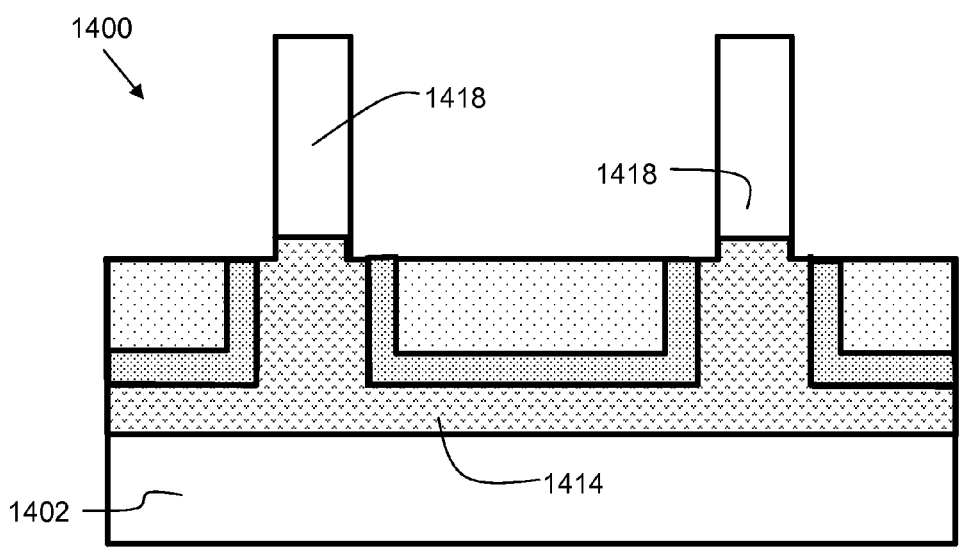

FIG. 14 shows a semiconductor structure after a subsequent processing step for the embodiment of FIG. 9 of performing spacer removal.

Figure 15:
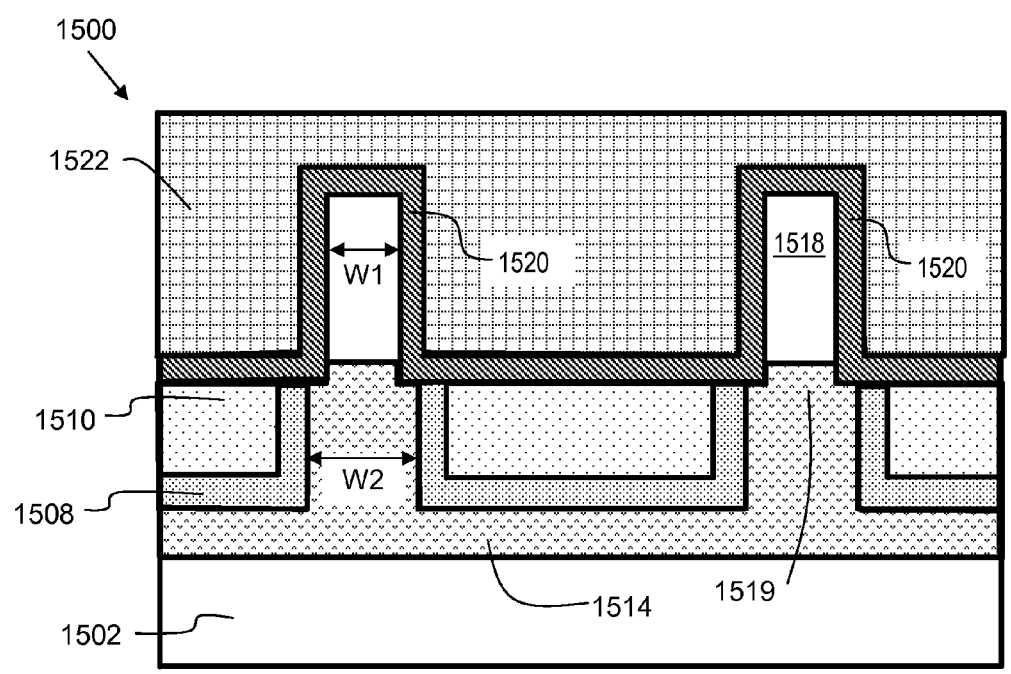

FIG. 15 shows a semiconductor structure in accordance with an embodiment of the present invention.

Figure 16:
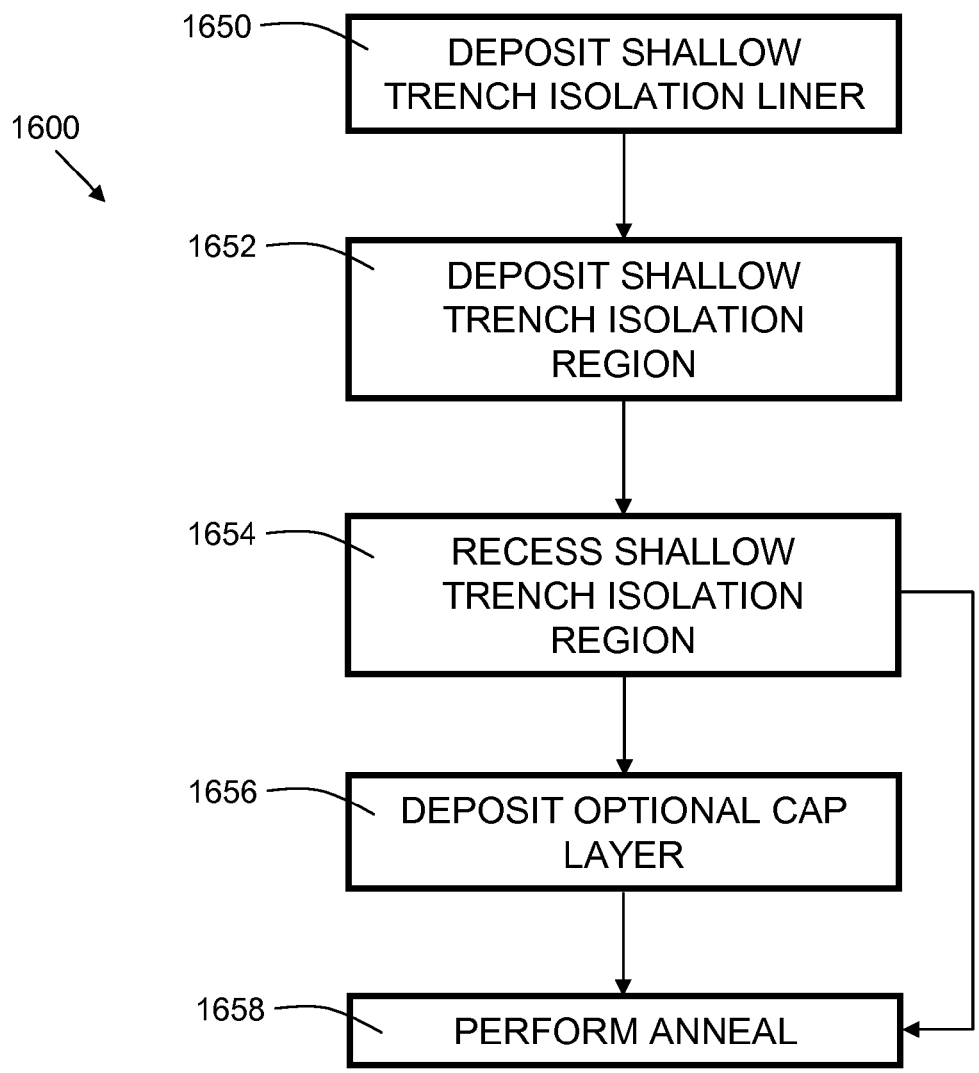

FIG. 16 is a flowchart indicating process steps for an embodiment of the present invention.

Figure 17:
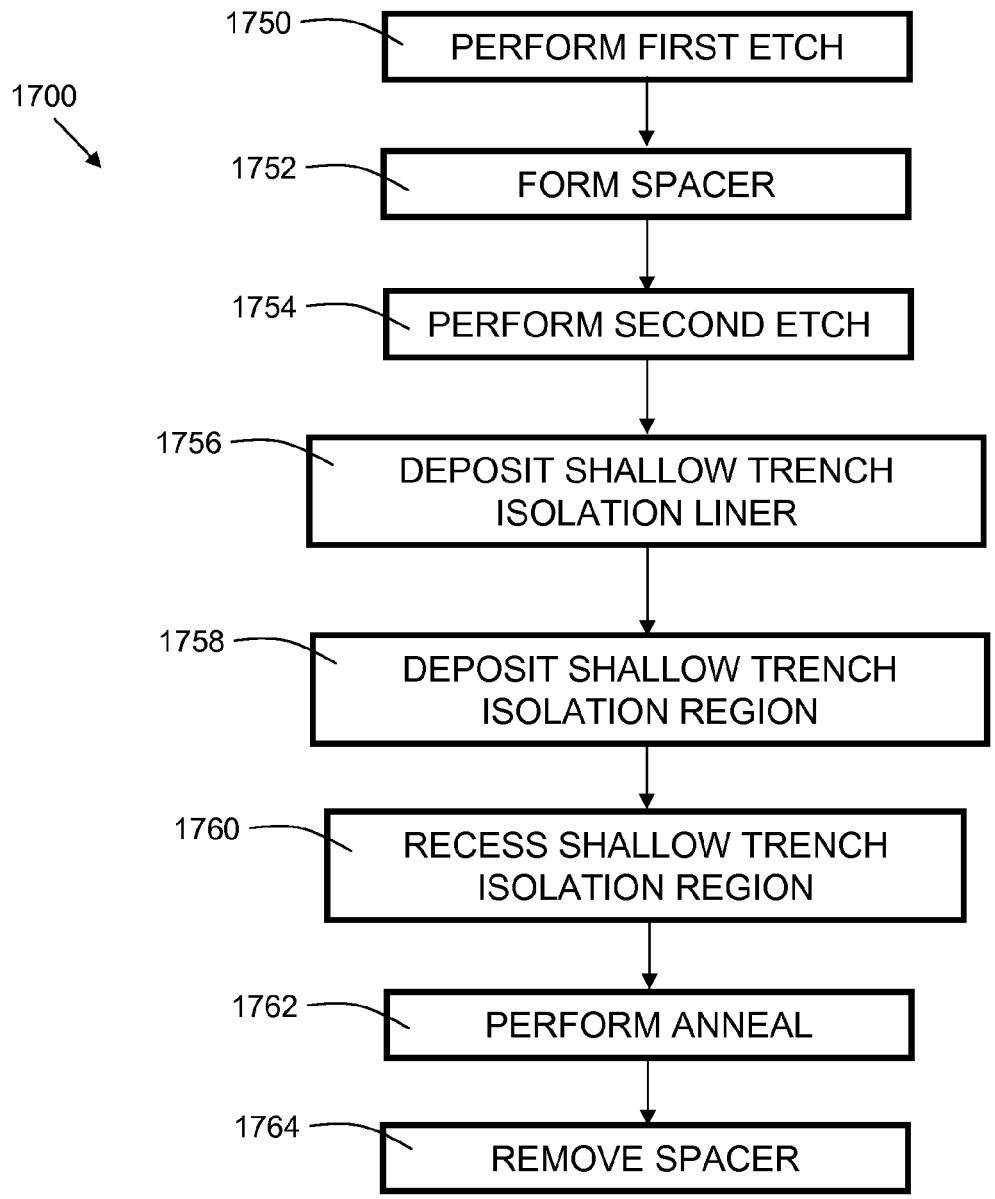

FIG. 17 is a flowchart indicating process steps for another embodiment of the present invention.

DETAILED DESCRIPTION

FIG. 1 shows a semiconductor structure 100 at a starting point for an embodiment of the present invention. A bulk substrate 102 forms the base of semiconductor structure 100.

Bulk substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Using industry-standard deposition and patterning techniques, a plurality of fins 104 are formed in the bulk substrate 102. A pad nitride layer 106 is disposed on top of each fin 104.

FIG. 2 shows a semiconductor structure 200 after a subsequent processing step for an embodiment of the present invention of depositing a doped shallow trench isolation liner 208 over the semiconductor structure. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. In some embodiments, the shallow trench isolation (STI) liner 208 has a thickness T ranging from about 3 nanometers to about 10 nanometers. In some embodiments, the shallow trench isolation (STI) liner 208 has a thickness T ranging from about 4 nanometers to about 8 nanometers. In some embodiments, the STI liner 208 is deposited via chemical vapor deposition (CVD). In other embodiments, the STI liner 208 is deposited via atomic layer deposition (ALD).

The STI liner 208 is doped with the opposite type of dopants used in the active area of the source and drain regions of the finFET. In the case of a pFET, the STI liner 208 is n-doped. In the case of an nFET, the STI liner 208 is p-doped. In one embodiment, the STI liner 208 is comprised of an arsenic-doped oxide, such as arsenic silicon glass (ASG). In another embodiment, STI liner 208 is comprised of a boron-doped oxide, such as borosilicate glass (BSG). In some embodiments, the STI liner has a dopant concentration ranging from about 1E19 atoms per cubic centimeter to about 1E21 atoms per cubic centimeter. In other embodiments, the STI liner has a dopant concentration ranging from about 1E21 atoms per cubic centimeter to about 5E21 atoms per cubic centimeter.

FIG. 3 shows a semiconductor structure 300 after a subsequent processing step for an embodiment of the present invention of forming shallow trench isolation regions 310. The shallow trench isolation (STI) regions 310 may be comprised of oxide, and may be deposited via chemical vapor deposition (CVD), or a high-density plasma (HDP) technique. Optionally, the STI regions 310 may be planarized after the deposition process so that the STI regions 310 are planar with the top of the STI liner 308. The planarization, if performed, may be performed via a chemical mechanical polish (CMP) process.

FIG. 4 shows a semiconductor structure 400 after a subsequent processing step for an embodiment of the present invention of performing a shallow trench isolation region recess. In one embodiment, the recess is performed via a chemical oxide removal (COR) process. In another embodiment, the recess is performed via a wet etch. The wet etch may utilize an etchant of hydrofluoric acid (HF). In another embodiment, the recess is performed via reactive ion etch (RIE). The recess leaves an upper portion 418 of the fins exposed, where the upper portion 418 of the fins has a height F. In one embodiment, the height F of the upper portion 418 of the fins ranges from about 15 nanometers to about 150 nanometers. In one embodiment, the height F of the upper portion 418 of the fins ranges from about 30 nanometers to about 50 nanometers.

FIG. 5 shows a semiconductor structure 500 after a subsequent optional processing step for an embodiment of the present invention of depositing a cap layer 512. In some embodiments, the cap layer 512 is comprised of nitride. The cap layer 512 serves to provide additional protection of the upper portion 518 of the fins during the fabrication process, to prevent unwanted dopants from diffusing into the upper portion 518 of the fins.

FIG. 6 shows a semiconductor structure 600 after a subsequent processing step for an embodiment of the present invention of performing an anneal. The anneal causes diffusion of dopants from the STI liner 608, forming punchthrough stopper 614. Punchthrough stopper 614 extends from the upper portion of the bulk substrate into the lower portion 619 of the fins. In some embodiments, the anneal is performed at a temperature ranging from about 900 degrees Celsius to about 1300 degrees Celsius for a duration ranging from about 1 millisecond to about 60 seconds. The anneal can be done by rapid thermal processing (RTP), furnace anneal, laser anneal, flash anneal, or any suitable combination of those techniques.

FIG. 7 shows a semiconductor structure 700 after a subsequent processing step of removing the optional cap layer (compare with 512 of FIG. 5) and pad layer (compare with 106 of FIG. 1). As can be seen in FIG. 7, fin 721 is comprised of upper portion 718 having a height U, and a lower portion 719 having a height L. Hence, the total height of the fin is X, where X=U+L. In some embodiments, the total height X ranges from about 50 nanometers to about 170 nanometers. In other embodiments, the total height X ranges from about 100 nanometers to about 220 nanometers. In some embodiments, the lower portion of each fin has a height L ranging from about 0.4 times the total height to about 0.6 times the total height X. The punchthrough stopper region 714 is in the lower portion of each fin, and forms a contiguous punchthrough stopper region in the semiconductor structure, below a base of each fin.

FIG. 8 shows a semiconductor structure 800 in accordance with an embodiment of the present invention. Structure 800 comprises a semiconductor substrate 802. Multiple fins are formed in the semiconductor substrate. Each fin has an upper portion 818, and a lower portion 819. Lower portion 819 is part of the punchthrough stopper 814, and contains dopants that were diffused from STI liner 808 during an anneal process. A shallow trench isolation (STI) region 810 is disposed between each fin. In particular, the shallow trench isolation (STI) region 810 is disposed between the lower portion 819 of each fin. A gate dielectric layer 820 is disposed over each fin. In particular, gate dielectric layer 820 is disposed over the upper portion 818 of each fin. In some embodiments, gate dielectric layer 820 may include but is not limited to: hafnium silicate (HfSiO), hafnium oxide (HfO2), zirconium silicate (ZrSiOx), zirconium oxide (ZrO2), silicon oxide (SiO2), silicon nitride (Si3N4), silicon oxynitride (SiON), or any other high-k material (k>4.0) or any combination of these materials. A gate region 822 is disposed over the gate dielectric layer 820. In some embodiments, gate region 822 is comprised of polysilicon. In other embodiments, gate region 822 is a replacement metal gate (RMG), and may be comprised of a metal such as aluminum, titanium nitride (TiN) or ruthenium (Ru) for a pFET, or titanium aluminum (TiAl), aluminum nitride (AlN) or tantalum carbide (TaC) for an nFET.

FIG. 9 shows a semiconductor structure 900 at a starting point for another embodiment of the present invention. In this embodiment, the structure 900 is recessed such that each fin 904 is formed to a first depth D1. This is different than structure 100, where the structure is recessed to its final depth in a single recess step. The recess may be performed via a reactive ion etch (RIE) process. In some embodiments, D1 ranges from about 50 nanometers to about 100 nanometers. In other embodiments, D1 ranges from about 40 nanometers to about 80 nanometers. A pad nitride layer 906 is disposed on top of each fin 904.

FIG. 10 shows a semiconductor structure 1000 after a subsequent processing step for the embodiment of FIG. 9 of forming spacers 1024 on fin sidewalls. The spacers 1024 may be comprised of nitride, and may be formed using industry-standard deposition and patterning techniques.

FIG. 11 shows a semiconductor structure 1100 after a subsequent processing step for the embodiment of FIG. 9 of performing a second etch. The second etch extends the length of each fin by a depth D2. Hence, each fin has an upper portion 1118 and a lower portion 1119. The spacers 1124 are disposed adjacent to the upper portion 1118 of each fin, and the lower portion 1119 of each fin is not covered by spacer 1124. In some embodiments, D2 ranges from about 20 nanometers to about 60 nanometers. In other embodiments, D2 ranges from about 40 nanometers to about 70 nanometers.

Spacers 1124 have a finite thickness. In some embodiments, the thickness of spacers 1124 ranges from about 5 nanometers to about 10 nanometers. The presence of spacers 1124 prevent material underneath the spacers from being removed during the second etch. Hence, the upper portion 1118 of each fin has a first width W1 and the lower portion 1119 of each fin has a second width W2, where W1<W2. In some embodiments, W1 is in the range of 20 nanometers to 40 nanometers, and W2 is in the range of 30 nanometers to 55 nanometers. In other embodiments, W1 is in the range of 30 nanometers to 50 nanometers, and W2 is in the range of 40 nanometers to 60 nanometers.

FIG. 12 shows a semiconductor structure 1200 after a subsequent processing step for the embodiment of FIG. 9 of depositing a shallow trench isolation liner 1208 and shallow trench isolation region 1210, and performing a recess such that the shallow trench isolation regions 1210 are planar to the top of the lower portion 1219 of each fin. The STI liner 1208 and STI region 1210 are formed of similar materials to that of STI liner 308 and STI region 310 (see FIG. 3).

FIG. 13 shows a semiconductor structure 1300 after a subsequent processing step for the embodiment of FIG. 9 of performing an anneal. In some embodiments, the anneal is performed at a temperature ranging from about 900 degrees Celsius to about 1300 degrees Celsius for a time ranging from about 1 millisecond to about 60 seconds. The anneal causes dopants to diffuse from the STI liner (1208 of FIG. 12) and forms punchthrough stopper 1314, which occupies the upper portion of bulk substrate 1302, and the lower portion 1319 of the fins.

FIG. 14 shows a semiconductor structure 1400 after a subsequent processing step for the embodiment of FIG. 9 of removing the spacers (compare 1024 of FIG. 10 and 906 of FIG. 9).

FIG. 15 shows a semiconductor structure 1500 in accordance with an embodiment of the present invention. Structure 1500 comprises a semiconductor substrate 1502. Multiple fins are formed in the semiconductor substrate. Each fin has an upper portion 1518, and a lower portion 1519. Lower portion 1519 is part of the punchthrough stopper 1514, and contains dopants that were diffused from STI liner 1508 during an anneal process. Lower portion 1519 is wider than upper portion 1518. Upper portion 1518 has a width W1 and lower portion 1519 has a width W2, where W1<W2. A shallow trench isolation (STI) region 1510 is disposed between each fin. In particular, the shallow trench isolation (STI) region 1510 is disposed between the lower portion 1519 of each fin. A gate dielectric layer 1520 is disposed over each fin. In particular, gate dielectric layer 1520 disposed is over the upper portion 1518 of each fin. In some embodiments, gate dielectric layer 1520 may include but is not limited to: hafnium silicate (HfSiO), hafnium oxide (HfO2), zirconium silicate (ZrSiOx), zirconium oxide (ZrO2), silicon oxide (SiO2), silicon nitride (Si3N4), silicon oxynitride (SiON), or any other high-k material (k>4.0) or any combination of these materials. A gate region 1522 is disposed over the gate dielectric layer 1520. In some embodiments, gate region 1522 is comprised of polysilicon. In other embodiments, gate region 1522 is a replacement metal gate (RMG), and may be comprised of a metal such as aluminum, titanium nitride (TiN) or ruthenium (Ru) for a pFET, or titanium aluminum (TiAl), aluminum nitride (AlN) or tantalum carbide (TaC) for an nFET.

FIG. 16 is a flowchart 1600 indicating process steps for an embodiment of the present invention. In process step 1650, a shallow trench isolation (STI) liner is deposited (see 208 of FIG. 2). In process step 1652, a shallow trench isolation (STI) region is deposited (see 310 of FIG. 3). In process step 1654, the STI region is recessed (see 410 of FIG. 4). In process step 1656, optionally, a cap layer is deposited (see 512 of FIG. 5). In process step 1658, an anneal is performed to diffuse dopants from the STI liner and form the punchthrough stopper (see 614 of FIG. 6).

FIG. 17 is a flowchart 1700 indicating process steps for another embodiment of the present invention. In process step 1750, a first etch is performed (see 900 of FIG. 9). In process step 1752, spacers are formed on the upper portion of the fins (see 1024 of FIG. 10). In process step 1754, a second etch is performed (see 1100 of FIG. 11). In process step 1756, an STI liner is deposited (see 1208 of FIG. 12). In process step 1758, an STI region is deposited (see 1210 of FIG. 12). In process step 1760, the STI region is recessed (see 1200 of FIG. 12). In process step 1762, an anneal is performed to form the punchthrough region (see 1314 of FIG. 13). In process step 1764, the spacers are removed (see 1400 of FIG. 14).

Embodiments of the present invention provide for an improved punchthrough stopper. The dopants used to form the punchthrough stopper are diffused from an STI liner, rather than through ion implantation. The drawback of the ion implantation method is that it induces device variability due to some dopants from the punchthrough stopper getting into the upper portion of the fin or channel region. With embodiments of the present invention, the dopants do not need to pass through the fins and channel region of the finFET in order to form the punchthrough stopper. Hence, this technique reduces the device variability caused when forming the punchthrough region, as the undesired dopant residues in the channel region are reduced. Furthermore, the punchthrough stopper is self-aligned to the gate and channel. Hence, an improved finFET device is achieved through embodiments of the present invention.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure, comprising:
   a semiconductor substrate;
   a plurality of fins formed in the semiconductor substrate, wherein each fin has an upper portion and a lower portion;
   a punchthrough stopper region disposed in the lower portion of each fin of the plurality of fins;
   a shallow trench isolation region disposed between each fin;
   a doped shallow trench isolation liner disposed underneath the shallow trench isolation region and also disposed between each fin;
   a gate dielectric layer disposed over the plurality of fins; and
   a gate region disposed over the gate dielectric layer;
   wherein the punchthrough stopper region is in the lower portion of each fin, and forms a contiguous region in the semiconductor structure, between each fin, and below a base of each fin, and directly underneath the doped shallow trench isolation liner.

2. The semiconductor structure of claim 1, wherein the doped shallow trench isolation liner is comprised of arsenic silicon glass.

3. The semiconductor structure of claim 1, wherein the doped shallow trench isolation liner is comprised of borosilicate glass.

4. The semiconductor structure of claim 1, wherein the doped shallow trench isolation liner has a thickness ranging from about 3 nanometers to about 10 nanometers.

5. The semiconductor structure of claim 1, wherein the shallow trench isolation region disposed between each fin is comprised of oxide.

6. The semiconductor structure of claim 1, wherein each fin of the plurality of fins has a total height ranging from about 50 nanometers to about 170 nanometers.

7. The semiconductor structure of claim 6, wherein the lower portion of each fin has a height ranging from about 0.4 times the total height to about 0.6 times the total height.

8. The semiconductor structure of claim 1, wherein the gate dielectric layer is comprised of hafnium oxide.

9. The semiconductor structure of claim 1, wherein the gate region is comprised of polysilicon.

10. The semiconductor structure of claim 1, wherein the gate region is comprised of metal.

11. The semiconductor structure of claim 1, wherein the upper portion of each fin is narrower than the lower portion of each fin.

12. The semiconductor structure of claim 11, wherein the upper portion of each fin has a width ranging from about 30 nanometers to about 50 nanometers, and wherein the lower portion of each fin has a width ranging from about 40 nanometers to about 60 nanometers.

* * * * *